(12) United States Patent
Takahashi

(10) Patent No.: US 6,838,775 B2
(45) Date of Patent: Jan. 4, 2005

(54) SEMICONDUCTOR DEVICE COMPRISING ESD PROTECTION CIRCUIT FOR PROTECTING CIRCUIT FROM BEING DESTRUCTED BY ELECTROSTATIC DISCHARGE

(75) Inventor: Makoto Takahashi, Yokohama (JP)

(73) Assignee: Kabushiki Kaisha Toshiba (JP)

( * ) Notice: Subject to any disclaimer, the term of this patent is extended or adjusted under 35 U.S.C. 154(b) by 0 days.

(21) Appl. No.: 10/693,132

(22) Filed: Oct. 23, 2003

(65) Prior Publication Data

US 2004/0119159 A1 Jun. 24, 2004

(30) Foreign Application Priority Data

Oct. 23, 2002 (JP) ........................................ 2002-308668

(51) Int. Cl.[7] .............................................. H01L 23/34
(52) U.S. Cl. ...................... 257/778; 257/691; 257/724; 257/693
(58) Field of Search ................................ 257/778, 724, 257/691, 693

(56) References Cited

U.S. PATENT DOCUMENTS

| | | | | | |
|---|---|---|---|---|---|
| 5,414,299 A | * | 5/1995 | Wang et al. | ................ | 257/702 |
| 5,866,924 A | * | 2/1999 | Zhu | ............................ | 257/208 |
| 5,904,499 A | * | 5/1999 | Pace | ........................... | 438/108 |
| 6,046,901 A | * | 4/2000 | Davis et al. | ................ | 361/303 |
| 6,198,136 B1 | | 3/2001 | Voldman et al. | | |
| 6,303,996 B2 | * | 10/2001 | Lin | ............................. | 257/777 |
| 2003/0089979 A1 | * | 5/2003 | Malinowski et al. | ....... | 257/724 |

FOREIGN PATENT DOCUMENTS

JP        2000-164807        6/2000

* cited by examiner

Primary Examiner—Jasmine Clark
(74) Attorney, Agent, or Firm—Gray Cary Ware & Freidenrich LLP

(57) ABSTRACT

The semiconductor device includes an input/output circuit, a functional module, an electrostatic discharge protection circuit and bumps. The input/output circuit is formed close to an edge of the semiconductor chip. The functional module is formed on the semiconductor chip located on a central side with regard to the input/output circuit. The electrostatic discharge protection circuit is formed in the functional module of the semiconductor chip and serves to protect a circuit located in a downstream thereof, from being destructed by electrostatic discharge. The bumps are arranged on one of major surfaces of the semiconductor chip located close to the functional module, and they are connected to the functional module via the electrostatic discharge protection circuit.

35 Claims, 5 Drawing Sheets

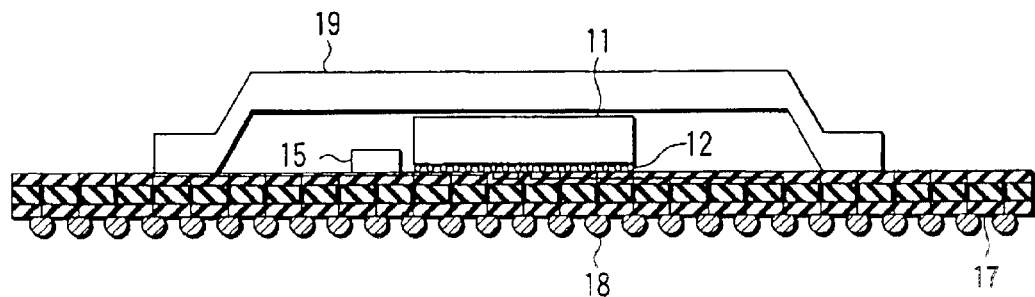
F I G. 8A
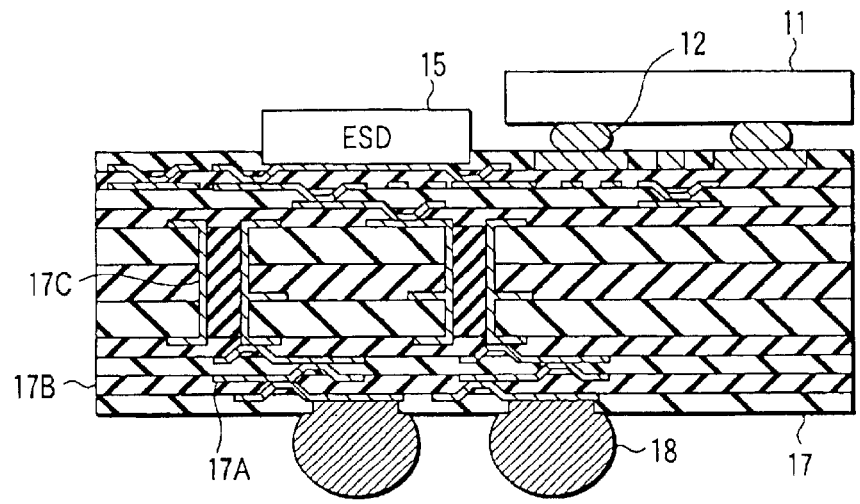
F I G. 8B
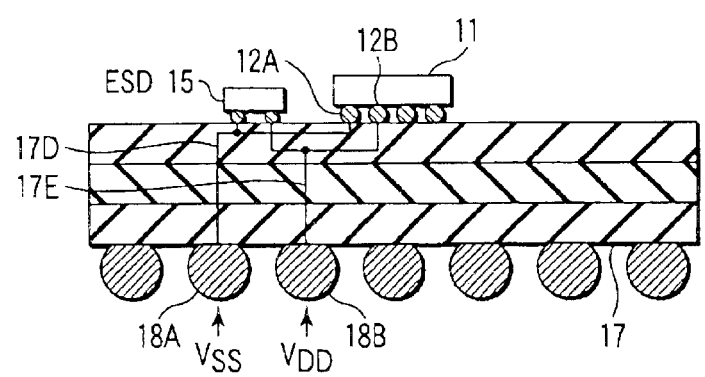
F I G. 8C

SEMICONDUCTOR DEVICE COMPRISING ESD PROTECTION CIRCUIT FOR PROTECTING CIRCUIT FROM BEING DESTRUCTED BY ELECTROSTATIC DISCHARGE

CROSS-REFERENCE TO RELATED APPLICATIONS

This application is based upon and claims the benefit of priority from the prior Japanese Patent Application No. 2002-308668, filed Oct. 23, 2002, the entire contents of which are incorporated herein by reference.

BACKGROUND OF THE INVENTION

1. Field of the Invention

The present invention relates to a semiconductor device comprising an ESD protection circuit for protecting a circuit from being destructed by electrostatic discharge (to be abbreviated as ESD hereinafter), and more specifically, to a semiconductor device that is connected by use of bumps arranged in a manner of a two-dimensional area.

2. Description of the Related Art

A semiconductor device comprising a conventional ESD protection circuit will now be described.

FIG. 1 is a plan view of a semiconductor device (silicon chip) that is to be connected to an external member by means of a bonding wire.

FIG. 1 shows an ordinary procedure of connecting the silicon chip to an outside member with a bonding wire, and as shown in this figure, a wire 103 is bonded to an input/output pad 102 provided close to an outer circumference of a silicon chip 101. The input/output pad 102 is connected to a functional module 105 formed at a central portion of the silicon chip via an input/output circuit 104. Note that FIG. 1 is a view taken from the surface side where the input/output pad 102 is formed.

The input/output circuit 104 comprises an input/output buffer including an ESD protection circuit, or a power input circuit including an ESD protection circuit. The functional module 105 is a circuit that has a pre-assigned function, which comprises a memory device such as DRAM, or an analog IP (analog intellectual property). When a signal or a power voltage is input from the bonding wire 103 to the device, the ESD protection circuit built in the input/output circuit 104 functions and thus the functional module 105 is protected from ESD.

FIG. 2 is a cross section of a flip chip package that carries out a connection between a semiconductor chip and a package substrate at a bump. FIG. 3 is a plan view of a silicon chip in the above-mentioned flip-flop package, and this view is taken from the surface side on which the bump is formed.

As shown in FIG. 2, a silicon chip 111 is connected onto a package substrate 112 with bumps 113. The silicon chip 111 is connected to balls 114 by the bumps 113, an interconnection layer formed on the package substrate, through-holes and the like. Further, the silicon chip 111 on the package substrate 112 is covered by a cap member 115.

Further, as shown in FIG. 3, in the silicon chip 111 of the flip-flop package, the bumps 113 (including 113A and 113B) are arranged in a two-dimensional manner on a surface of the silicon chip 111. The input/output circuit 116 is formed close to the outer circumference of the silicon chip 111, and a circuit having a pre-assigned function (to be called as functional module) 117 is formed inside the input/output circuit 116.

Here, it should be pointed out that when a silicon chip 111 and a package substrate 112 are connected to each other by means of bumps made by, for example, soldering, instead of bonding wires, as in the case of the flip chip package shown in FIG. 2, the following problem will be created.

That is, in the flip chip package, bumps 13A are formed not only close to the outer circumference of the silicon chip 11, but also bumps 13B are made at positions on an inner side than the input/output circuit 116 and also distant from the circuit 16. With this structure, it is not possible in some cases to transmit a signal inputted to a bump 113B to the functional module 117 provided at a central portion of the silicon chip 111 via the ESD protection circuit formed in the input/output circuit 116.

In particular, such a semiconductor chip in which a DRAM, some other memory, analog IP (analog intellectual property) and the like are mixedly integrated as functional modules, and each of these members has its own exclusive power source, entails the problem that a withstand voltage of the semiconductor chip against ESD is low when each exclusive power is input without being passed through an ESD protection circuit.

BRIEF SUMMARY OF THE INVENTION

According to an aspect of the present invention, there is provided a semiconductor device comprising: an input/output circuit formed close to an edge of a semiconductor chip; a functional module formed on the semiconductor chip located on a central side with regard to the input/output circuit; an electrostatic discharge protection circuit, formed in the functional module of the semiconductor chip, configured to protect a circuit located in a downstream thereof, from being destructed by electrostatic discharge; and bumps arranged on one of major surfaces of the semiconductor chip located close to the functional module and connected to the functional module via the electrostatic discharge protection circuit.

BRIEF DESCRIPTION OF THE SEVERAL VIEWS OF THE DRAWING

FIG. 8A is a cross sectional view showing a structure of a flip chip package according to a third embodiment of the present invention;

FIG. 8B is an enlarged cross sectional view showing an ESD protection circuit and a part of a semiconductor chip and a package substrate in the flip chip package;

FIG. 8C is a cross sectional view schematically showing an electric connection state with respect to the ESD protection circuit shown in FIG. 8B;

DETAILED DESCRIPTION OF THE INVENTION

Figure 1:
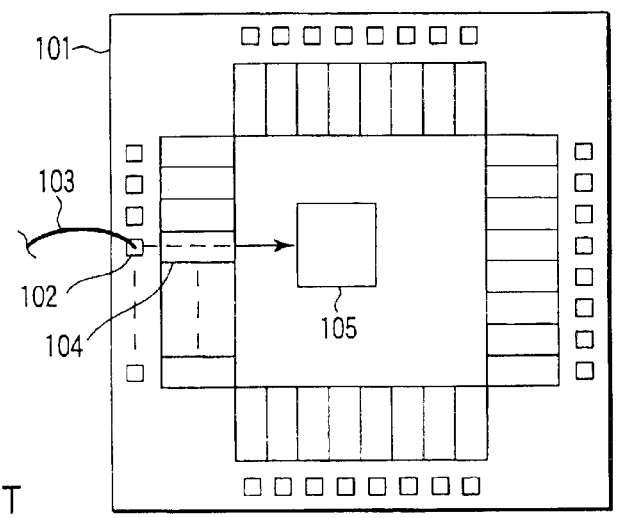
FIG. 1 is a plan view of a conventional semiconductor device that is connected to an outside member by means of a bonding wire.
Figure 2:
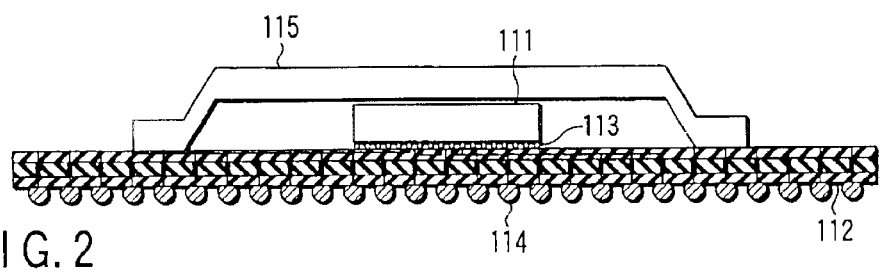
FIG. 2 is a cross sectional view of a conventional flip chip package that makes a connection between a semiconductor chip and a package substrate by means of a bump.
Figure 3:
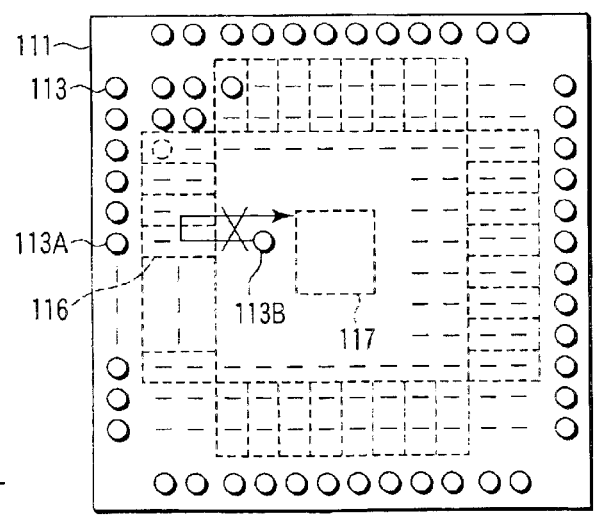
FIG. 3 is a plan view of a silicon chip in the flip-flop package.

Embodiments of the present invention will now be described with reference to accompanying drawings. In the explanations of the embodiments, common parts are designated by the same reference numerals or symbols throughout the figures.

First Embodiment

Figure 4:
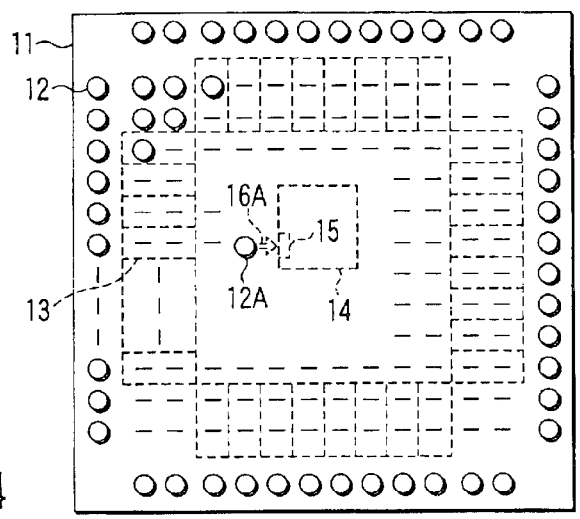
FIG. 4 is a plan view showing a structure of a semiconductor device equipped with an ESD protection circuit, according to a first embodiment of the present invention.

First, a semiconductor device according to the first embodiment of the present invention will now be described. FIG. 4 is a plan view showing the structure of the semiconductor device equipped with an ESD protection circuit, according to the first embodiment.

As shown in FIG. 4, on a first major surface of a semiconductor chip 11, bumps 12 are arranged in a two-dimensional manner. An input/output circuit 13 is formed close to an edge of the semiconductor chip 11. The input/output circuit 13 comprises an input/output buffer including an ESD protection circuit or a power input circuit including an ESD protection circuit. The ESD protection circuit is connected to a preceding stage to a circuit to be protected, and is a circuit configured to protect the circuit to be protected from ESD. In other words, it serves to protect a circuit provided after the protection circuit, from being destructed by electrostatic discharge. The bumps 12 are made of, for example, solder, Au or the like. It should be noted that FIG. 4 is a view taken from the surface on which the bumps 12 are formed.

Further, on an inner side with respect to the input/output circuit 13, that is, in a region close to the central portion of the semiconductor chip 11, a functional module 11 is formed. An ESD protection circuit 15 is formed in the functional module 14. As in the case described above, the ESD protection circuit 15 is connected to a preceding stage to a circuit to be protected, and is a circuit configured to protect the circuit to be protected from ESD. In other words, it serves to protect a circuit provided after the protection circuit, from being destructed by electrostatic discharge.

Figure 5A:
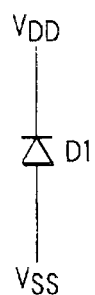
FIGS. 5A, 5B and 5C each are a circuit diagram showing the specific structure of the ESD protection circuit.

The ESD protection circuit 15 is made of, for example, a diode, a capacitor or the like. FIGS. 5A, SB and SC each are a specific circuit example of the ESD protection circuit 15. The ESD protection circuit 15 of a first example is made of a diode D1 as can be seen in FIG. 5A. Let us suppose here that a power voltage VDD and a ground potential Vss serving as a reference potential are supplied to the functional module 14. The diode D1 is connected between the power voltage VDD and ground potential Vss supplied to the functional module 14. More specifically, an anode of the diode D1 is connected to an interconnection through which the ground potential Vss is supplied, whereas a cathode of the diode D1 is connected to an interconnection through which the power voltage VDD is supplied.

Figure 5B:
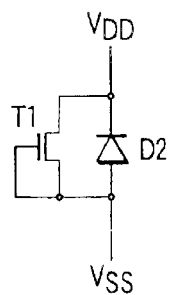

The ESD protection circuit 15 of a second example is made of a diode D2 and an n-channel MOS transistor T1 as can be seen in FIG. 5B. An anode of the diode D2 is connected to a drain and gate of the transistor T1, whereas a cathode of the diode D2 is connected to a source of the transistor T1. The anode of the diode D2 is connected to an interconnection through which the ground potential Vss is supplied, whereas the cathode of the diode D2 is connected to an interconnection through which the power voltage VDD is supplied.

Figure 5C:
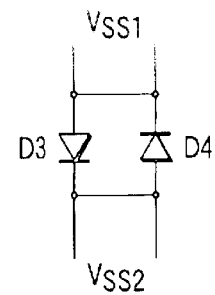

The ESD protection circuit 15 of a third example is made of diodes D3 and D4 as can be seen in FIG. 5C. An anode of the diode D3 is connected to a cathode of the diode D4, and a cathode of the diode D3 is connected to anode of the diode D4. Let us suppose here that two types of reference potentials, namely, a first reference potential Vss1 and a second reference potential Vss2 are supplied to the functional module 14. The anode of the diode D3 and the cathode of the diode D4 are connected to an interconnection through which the first reference potential Vss1 is supplied, whereas the cathode of the diode D3 and the anode of the diode D4 are connected to an interconnection through which the second reference potential Vss2 is supplied.

The functional module 14 is a circuit having a pre-assigned function, and is made of, for example, a DRAM and some other memory, or analog IP (analog intellectual property).

Of the bumps 12 arranged on the first major surface, bumps 12A connected to the functional module 14 are arranged in an area close to the functional module 14. The bumps 12A are connected to the functional module 14 by means of an interconnection layer 16A in the semiconductor chip 14 via the ESD protection circuit 15 in the functional module 14. With this structure, a power voltage (or signal) input from the bumps 12A is input to the functional module 14 via the ESD protection circuit 15 built in the functional module 14.

With regard to a semiconductor device having such a structure, the withstand voltage of the functional module 14 against ESD can be improved by inputting a power voltage or signal from the bumps 12A located close to the functional module 14 to the functional module 14 itself via the ESD protection circuit 15 provided in the functional module 14. Further, it is possible to prevent the deterioration of the wiring efficiency by using the ESD protection circuit 15 provided in the functional module 14 instead of using the ESD protection circuit provided in the input/output circuit 13 located close to the edge of the semiconductor chip 11.

Next, a semiconductor device according to an alternative version of the first embodiment of the present invention will now be described.

In the semiconductor device of this alternative version, bumps connected to the functional module are arranged on the first major surface within the area where the functional module is formed. The bumps are connected to the functional module via an ESD protection circuit provided in the functional module. The rest of the structure is the same as that of the first embodiment described above.

Figure 6:
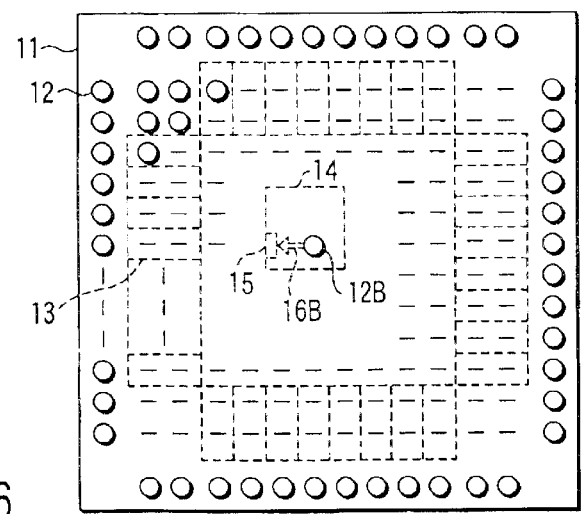
FIG. 6 is a plan view showing a structure of a semiconductor device equipped with an ESD protection circuit, according to an alternative version of the first embodiment.

FIG. 6 is a plan view showing the structure of the semiconductor device comprising an ESD protection circuit, according to the alterative version of the first embodiment, when viewed from the direction of the surface on which the bumps 12 are made.

The semiconductor device shown in FIG. 6 has such a structure that will now be described as in the case of the semiconductor device shown in FIG. 4. On a first major surface of a semiconductor chip 11, bumps 12 are arranged in a two-dimensional manner. An input/output circuit 13 is formed close to an edge of the semiconductor chip 11.

Further, on an inner side with respect to the input/output circuit 13, that is, in a region close to the central portion of the semiconductor chip 11, a functional module 14 is formed. An ESD protection circuit 15 is formed in the functional module 14.

Of the bumps 12 arranged on the first major surface, bumps 12B connected to the functional module 14 are arranged in an area close to the functional module 14 in the first major surface of the semiconductor chip 11. The bumps 12B are connected to the functional module 14 by means of an interconnection layer 16B in the semiconductor chip 14 via the ESD protection circuit 15 in the functional module 14. With this structure, a power voltage (or signal) input from the bumps 12B is input to the functional module 14 via the ESD protection circuit 15 built in the functional module 14.

With regard to a semiconductor device having such a structure, the withstand voltage of the functional module 14 against ESD can be improved by inputting a power voltage or signal from the bumps 12B located close to the functional module 14 to the functional module 14 itself via the ESD protection circuit 15 provided in the functional module 14. Further, it is possible to prevent the deterioration of the wiring efficiency by using the ESD protection circuit 15 provided in the functional module 14 instead of using the ESD protection circuit provided in the input/output circuit 13 located close to the edge of the semiconductor chip 11.

Second Embodiment

Next, a semiconductor according to the second embodiment of the present invention will now be described. The second embodiment will be described in connection with the case where the ESD protection circuit is provided close to the functional module and the bumps connected to the functional module are located close to the functional module itself.

Figure 7:
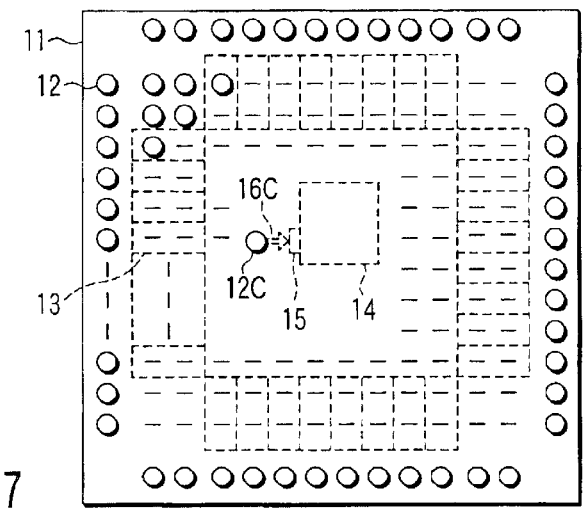
FIG. 7 is a plan view showing a structure of a semiconductor device equipped with an ESD protection circuit, according to a second embodiment of the present invention.

FIG. 7 is a plan view showing the structure of the semiconductor device comprising an ESD protection circuit, according to the second embodiment.

The semiconductor device shown in FIG. 7 has such a structure that will now be described as in the case of the semiconductor device shown in FIG. 4. On a first major surface of a semiconductor chip 11, bumps 12 are arranged in a two-dimensional manner. An input/output circuit 13 is formed close to an edge of the semiconductor chip 11. Note that FIG. 7 is a view taken from the direction of the surface on which the bumps 12 are made.

Further, on an inner side with respect to the input/output circuit 13, that is, in a region close to the central portion of the semiconductor chip 11, a functional module 14 is formed. An ESD protection circuit 15 is formed in an area close to the functional module 14.

Of the bumps 12 arranged on the first major surface, bumps 12C connected to the functional module 14 are arranged in an area close to the functional module 14 in the first major surface of the semiconductor chip 11. The bumps 12C are connected to the functional module 14 by means of an interconnection layer 16C in the semiconductor chip 11 via the ESD protection circuit 15 provided close to the functional module 14. With this structure, a power voltage (or signal) input from the bumps 12C is input to the functional module 14 via the ESD protection circuit 15 located close to the functional module 14.

With regard to a semiconductor device having such a structure, the withstand voltage of the functional module 14 against ESD can be improved by inputting a power voltage or signal from the bumps 12C located close to the functional module 14 to the functional module 14 itself via the ESD protection circuit 15 provided in the functional module 14. Further, it is possible to prevent the deterioration of the wiring efficiency by using the ESD protection circuit 15 located close to the functional module 14 instead of using the ESD protection circuit provided in the input/output circuit 13 located close to the edge of the semiconductor chip 11.

Third Embodiment

Next, a semiconductor device according to the third embodiment of the present invention will now be described. The third embodiment will be described in connection with a flip chip package in which a semiconductor chip is connected to a package substrate with a flip chip.

FIG. 8A is a cross sectional view showing the structure of a flip chip package according to the third embodiment.

As shown in FIG. 8A, a semiconductor chip 11 is connected to the first major surface of a package substrate 17 by means of bumps 12. This semiconductor chip 11 has a similar structure to that of the semiconductor chip shown in FIG. 7 except that the ESD protection circuit 15 is omitted therefrom. An ESD protection circuit 15 is formed on the first major surface of the package substrate 17 to be located close to the semiconductor chip 11. Balls 18 are arranged on the second major surface of the package substrate 17, on an opposite side to the first major surface. On the first major surface of the package substrate 17, a cap member 19 is formed to cover the semiconductor chip 11 and the ESD protection circuit 15 for protection. The balls 18 contain bumps made of solder or the like, and the cap member 19 is formed of a mold or metal or the like.

FIG. 8B is an enlarged cross sectional view of the ESC protection circuit 15 and a part of the semiconductor chip 11 and package substrate 17 shown in FIG. 8A. The package substrate 17 is made of a lamination substrate in which a great number of interconnection layers 17A and a great number of insulation layers 17B are laminated. Further, in the package substrate 17, a through-hole 17C is made to connect between interconnection layers 17A.

The balls 18 connected to an outside member are connected to the ESD protection circuit 15 via the interconnection layers 17A and the through hole 17C. The ESD protection circuit 15 is connected to the bumps 12 via the interconnection layers 17A in the package substrate 17. Further, the bumps 12 are connected to the functional module 14 formed in the semiconductor chip 11.

FIG. 8C is a cross sectional diagram schematically showing an electrical connection state to the ESD protection circuit 15 shown in FIG. 8B. For example, a ball 18A through which a ground potential Vss serving as a reference potential is supplied is connected to a bump 12A by means of connection means 17D made of the interconnection layer and through hole. Meanwhile, a ball 18B through which a power voltage VDD is supplied is connected to a bump 12B by means of connection means 17E made of the interconnection layer and a through hole. Each of the bumps 12A and 12B is connected to the functional module 14 formed in the semiconductor chip 11. Further, the ESD protection circuit 15 is connected between the connection means 17D and connection means 17E. With this structure, an end of the ESD protection circuit 15 is connected to the connection means 17D through which a ground potential Vss is supplied, and the other end of the ESD protection circuit 15 is connected to the connection means 17E through which a power voltage VDD is supplied.

In a semiconductor device having the above-described structure, an ESD protection circuit 15 is provided close to the semiconductor chip 11 on the first major surface of the package substrate 17 instead of using the ESD protection circuit in the input/output circuit 13 placed close to an edge of the semiconductor chip 11. Thus, a power voltage or signal is input from the balls 18, 18A and 18B to the functional module 14 in the semiconductor chip 11 via the ESD protection circuit 15 provided close to the semiconductor chip 11. In this manner, the withstand voltage of the functional module 14 against ESD can be improved.

Next, a semiconductor device according to a first alternative version of the third embodiment of the present invention will now be described. The structure of the first alternative version is similar to that of the third embodiment described above except that the ESD protection circuit 15 is provided on the surface of the package substrate 17 on which the balls are formed.

Figure 9A:
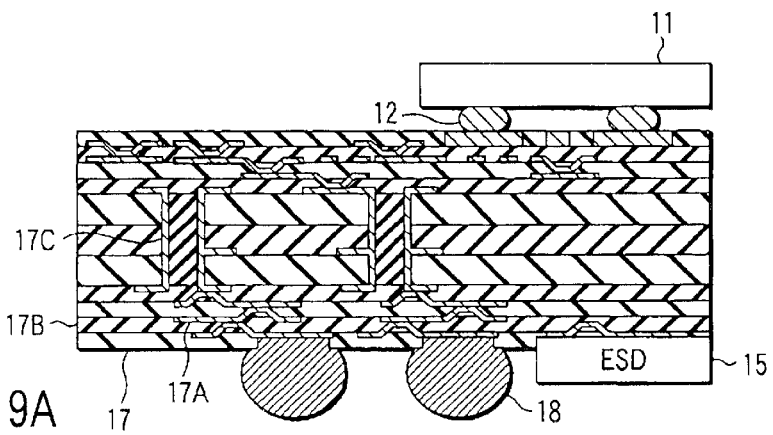
FIG. 9A is an enlarged cross sectional view showing an ESD protection circuit, and a part of a semiconductor chip and a package substrate in a flip chip package according to a first alternative version of the third embodiment.

FIG. 9A is an enlarged cross sectional view showing the ESD protection circuit 15, and a part of the semiconductor chip 11 and package substrate 17 in the flip chip package according to the first alternative version of the third embodiment.

The ESD protection circuit 15 is formed on the second major surface of the package substrate 17, (that is, the surface on which the balls 18 are formed) opposite side to the first major surface on which the semiconductor chip 11 is connected in a flip chip manner. The balls 18 connected to the outside are connected to the ESD protection circuit 15 formed on the surface on which the balls are formed, via the interconnection layer 17A in the package substrate 17. The ESD protection circuit 15 is connected to the bumps 12 via the interconnection layer 17A and through hole 17C in the package substrate 17. Further, the bumps 12 are connected to the functional module 14 formed in the semiconductor chip 11.

Figure 9B:
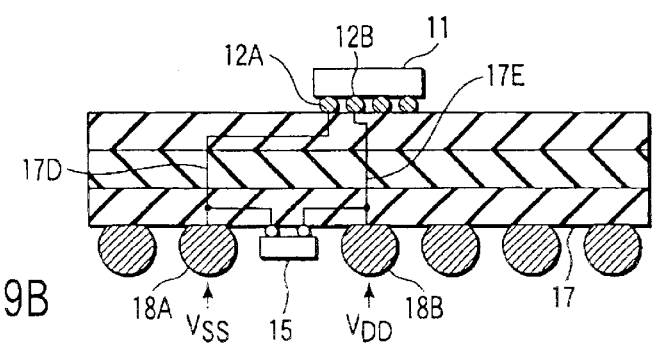
FIG. 9B is a cross sectional view schematically showing an electric connection state with respect to the ESD protection circuit 15 shown in FIG. 9A.

FIG. 9B is a cross sectional view schematically showing an electric connection state with regard to the ESD protection circuit 15 shown in FIG. 9A. For example, a ball 18A through which a ground potential Vss serving as the reference potential is supplied is connected to a bump 12A by means of connection means 17D made of the interconnection layer and through hole. Meanwhile, a ball 18B through which a power voltage VDD is connected to a bump 12B by means of connection means 17E made of the interconnection layer and through hole. Each of the bumps 12A and 12B is connected to the functional module 14 formed in the semiconductor chip 11. Further, the ESD protection circuit 15 is connected between the connection means 17D and connection means 17E. With this structure, an end of the ESD protection circuit 15 is connected to the connection means 17D through which a ground potential Vss is supplied, and the other end of the ESD protection circuit 15 is connected to the connection means 17E through which a power voltage VDD is supplied.

In a semiconductor device having the above-described structure, an ESD protection circuit 15 is provided on the surface where the balls are formed to be connected to the external terminal, instead of using the ESD protection circuit in the input/output circuit 13 placed close to an edge of the semiconductor chip 11. Thus, a power voltage or signal is input from the balls 18, 18A and 18B to the functional module 14 in the semiconductor chip 11 via the ESD protection circuit 15 provided on the surface where the balls are formed. In this manner, the withstand voltage of the functional module 14 against ESD can be improved.

Next, a semiconductor device according to a second alternative version of the third embodiment of the present invention will now be described. The structure of the second alternative version is similar to that of the third embodiment described above except that the ESD protection circuit 15 is provided inside the package substrate 17.

Figure 10A:
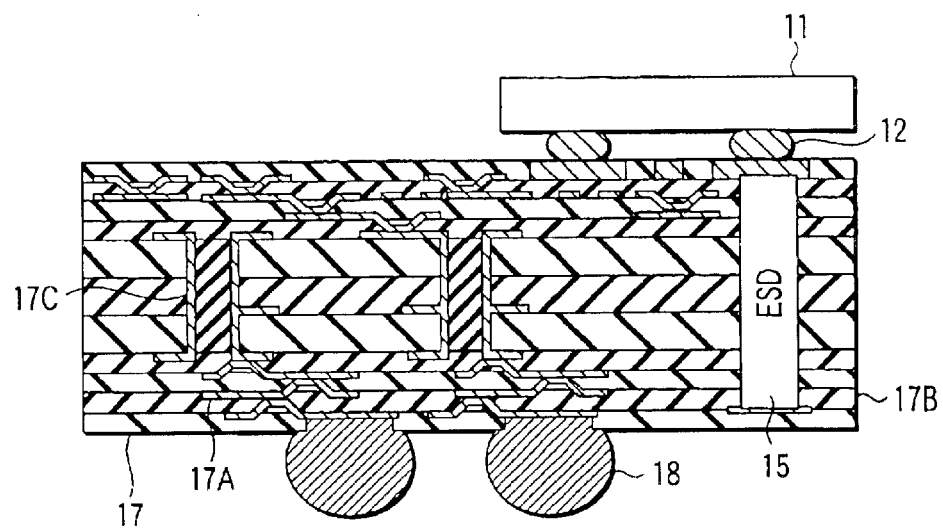
FIG. 10A is an enlarged cross sectional view showing an ESD protection circuit, and a part of a semiconductor chip and a package substrate in a flip chip package according to a second alternative version of the third embodiment.

FIG. 10A is an enlarged cross sectional view showing the ESD protection circuit 15, and a part of the semiconductor chip 11 and package substrate 17 in the flip chip package according to the second alternative version of the third embodiment.

The ESD protection circuit 15 is formed in a plurality of insulation layers 17B laminated inside the package substrate 17. The balls 18 connected to the outside are connected to the ESD protection circuit 15 formed in the insulation layers 17B via the interconnection layer 17A in the package substrate 17. The ESD protection circuit 15 is connected to the bumps 12 via the interconnection layer 17A in the package substrate 17. Further, the bumps 12 are connected to the functional module 14 formed in the semiconductor chip 11.

Figure 10B:
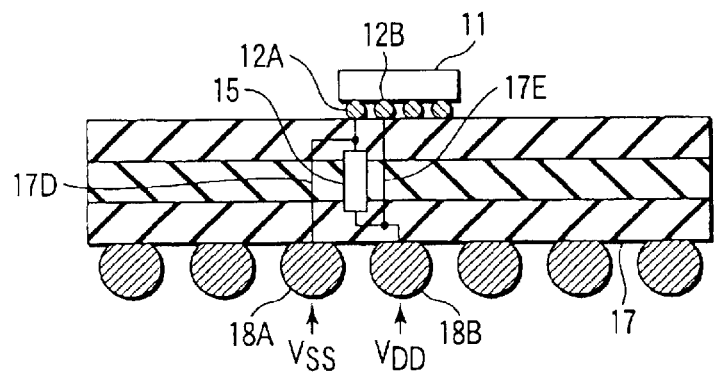
FIG. 10B is a cross sectional view schematically showing an electric connection state with respect to the ESD protection circuit shown in FIG. 10A.
Figure 10C:
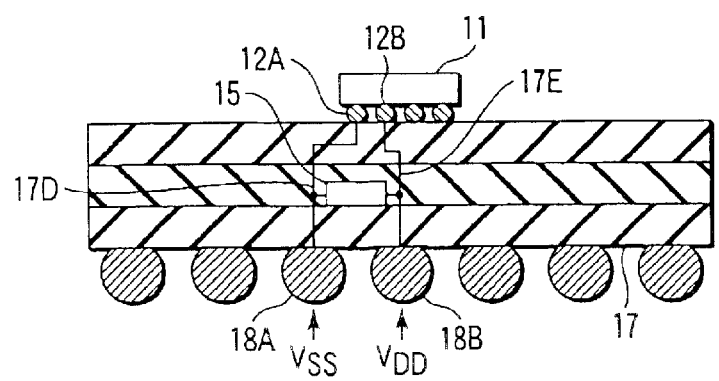
FIG. 10C is a cross sectional view schematically showing another example of the electric connection state with respect to the ESD protection circuit.

FIG. 10B is a cross sectional view schematically showing an electric connection state with regard to the ESD protection circuit 15 shown in FIG. 10A. For example, a ball 18A through which a ground potential Vss serving as the reference potential is supplied is connected to a bump 12A by means of connection means 17D made of the interconnection layer and through hole. Meanwhile, a ball 18B through which a power voltage VDD is supplied is connected to a bump 12B by means of connection means 17E made of the interconnection layer and through hole. Each of the bumps 12A and 12B is connected to the functional module 14 formed in the semiconductor chip 11. Further, the ESD protection circuit 15 is connected between the connection means 17D and connection means 17E. With this structure, an end of the ESD protection circuit 15 is connected to the connection means 17D through which a ground potential Vss is supplied, and the other end of the ESD protection circuit 15 is connected to the connection means 17E through which a power voltage VDD is supplied. FIG. 10B shows an example in which an end and the other end of the ESD protection circuit 15 are arranged in the thickness direction of the package substrate 17. Meanwhile, FIG. 10C shows an example in which an end and the other end of the ESD protection circuit 15 are arranged in a direction parallel to the first or second major surface of the package substrate 17. The electrical connection state of the structure shown in FIG. 10C is the same as that shown in FIG. 10B.

In a semiconductor device having the above-described structure, an ESD protection circuit 15 is provided within the package substrate 17, instead of using the ESD protection circuit in the input/output circuit 13 placed close to an edge of the semiconductor chip 11. Thus, a power voltage, a ground potential or signal is input from the balls 18, 18A and 18B to the functional module 14 in the semiconductor chip 11 via the ESD protection circuit 15 provided inside the package substrate 17. In this manner, the withstand voltage of the functional module 14 against ESD can be improved.

As described above, according to the embodiments of the present invention, it is possible to provide a semiconductor device that can assure a high withstand voltage against ESD even if input-use bumps are provided in a place remote from the input/output circuit provided close to an edge of the semiconductor chip.

Further, the versions of the above-described embodiments can be carried out solely or in combination. Furthermore, each of the embodiments described above contains various stages of inventions, and therefore, when structural elements disclosed in these embodiments are combined appropriately, various stages of inventions can be extracted.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
    an input/output circuit formed close to an edge of a semiconductor chip;
    a functional module formed on the semiconductor chip located on a central side with regard to the input/output circuit;
    an electrostatic discharge protection circuit, formed in the functional module of the semiconductor chip, configured to protect a circuit located in a downstream thereof, from being destructed by electrostatic discharge; and
    bumps arranged on one of major surfaces of the semiconductor chip located close to the functional module and connected to the functional module via the electrostatic discharge protection circuit.

2. The semiconductor device according to claim 1, wherein the bumps are arranged on that one of the major surface of the semiconductor chip within an area where the functional module is formed.

3. The semiconductor device according to claim 1, wherein the bumps includes a first bump and a second bump, the first bump is connected to the functional module by a first interconnection, the second bump is connected to the functional module by a second interconnection, and the electrostatic discharge protection circuit is connected between the first interconnection and the second interconnection.

4. The semiconductor device according to claim 1, wherein the functional module includes one of a memory device and an analog IP (analog intellectual property).

5. The semiconductor device according to claim 4, wherein the memory device includes a DRAM.

6. The semiconductor device according to claim 1, wherein the electrostatic discharge protection circuit is made of a diode.

7. A semiconductor device comprising:
    an input/output circuit formed close to an edge of a semiconductor chip;
    a functional module formed on the semiconductor chip located on a central side with regard to the input/output circuit;
    an electrostatic discharge protection circuit, formed in the functional module of the semiconductor chip, configured to protect a circuit located in a downstream thereof, from being destructed by electrostatic discharge; and
    bumps arranged in a two-dimensional manner on one of major surfaces of the semiconductor chip, that of the bumps that being located close to the functional module are connected to the functional module via the electrostatic discharge protection circuit.

8. The semiconductor device according to claim 7, wherein the bumps are arranged on that one of the major surface of the semiconductor chip within an area where the functional module is formed.

9. The semiconductor device according to claim 7, wherein the bumps includes a first bump and a second bump, the first bump is connected to the functional module by a first interconnection, the second bump is connected to the functional module by a second interconnection, and the electrostatic discharge protection circuit is connected between the first interconnection and the second interconnection.

10. The semiconductor device according to claim 7, wherein the functional module includes one of a memory device and an analog IP (analog intellectual property).

11. The semiconductor device according to claim 10, wherein the memory device includes a DRAM.

12. The semiconductor device according to claim 7, wherein the electrostatic discharge protection circuit is made of a diode.

13. A semiconductor device comprising:
    an input/output circuit formed close to an edge of a semiconductor chip;
    a functional module formed on the semiconductor chip located on a central side with regard to the input/output circuit;
    an electrostatic discharge protection circuit, formed close to the functional module of the semiconductor chip, configured to protect a circuit located in a downstream thereof, from being destructed by electrostatic discharge; and
    bumps arranged on one of major surfaces of the semiconductor chip located close to the functional module and connected to the functional module via the electrostatic discharge protection circuit.

14. The semiconductor device according to claim 13, wherein the bumps includes a first bump and a second bump, the first bump is connected to the functional module by a first interconnection, the second bump is connected to the functional module by a second interconnection, and the electrostatic discharge protection circuit is connected between the first interconnection and the second interconnection.

15. The semiconductor device according to claim 13, wherein the functional module includes one of a memory device and an analog IP (analog intellectual property).

16. The semiconductor device according to claim 15, wherein the memory device includes a DRAM.

17. The semiconductor device according to claim 13, wherein the electrostatic discharge protection circuit is made of a diode.

18. A semiconductor device comprising:
    an input/output circuit formed close to an edge of a semiconductor chip;
    a functional module formed on the semiconductor chip located on a central side with regard to the input/output circuit;
    bumps arranged on one of major surfaces of the semiconductor chip;
    a package substrate connected to the semiconductor chip by the bumps;
    an electrostatic discharge protection circuit, formed on a surface of the package substrate, to which the semiconductor chip is connected, and configured to protect a circuit located in a downstream thereof, from being destructed by electrostatic discharge; and an external connection terminal provided on a surface of the package substrate, opposite to the surface to which the semiconductor chip is connected, the external connection terminal being connected to the functional module of the semiconductor chip via the electrostatic discharge protection circuit.

19. The semiconductor device according to claim 18, wherein the bumps includes a first bump and a second bump, the first bump is connected to the functional module by a first interconnection, the second bump is connected to the functional module by a second interconnection, and the electrostatic discharge protection circuit is connected between the first interconnection and the second interconnection.

20. The semiconductor device according to claim 18, wherein the functional module includes one of a memory device and an analog IP (analog intellectual property).

21. The semiconductor device according to claim 20, wherein the memory device includes a DRAM.

22. The semiconductor device according to claim 18, wherein the electrostatic discharge protection circuit is made of a diode.

23. The semiconductor device according to claim 18, wherein the external connection terminal includes bumps.

24. A semiconductor device comprising:

an input/output circuit formed close to an edge of a semiconductor chip;

a functional module formed on the semiconductor chip located on a central side with regard to the input/output circuit;

bumps arranged on one of major surfaces of the semiconductor chip;

a package substrate connected to the semiconductor chip by the bumps;

an electrostatic discharge protection circuit, formed on a surface of the package substrate, opposite to a surface to which the semiconductor chip is connected, and configured to protect a circuit located in a downstream thereof, from being destructed by electrostatic discharge; and an external connection terminal provided on the surface of the package substrate, opposite to the surface to which the semiconductor chip is connected, the external connection terminal being connected to the functional module of the semiconductor chip via the electrostatic discharge protection circuit.

25. The semiconductor device according to claim 24, wherein the bumps includes a first bump and a second bump, the first bump is connected to the functional module by a first interconnection, the second bump is connected to the functional module by a second interconnection, and the electrostatic discharge protection circuit is connected between the first interconnection and the second interconnection.

26. The semiconductor device according to claim 24, wherein the functional module includes one of a memory device and an analog IP (analog intellectual property).

27. The semiconductor device according to claim 26, wherein the memory device includes a DRAM.

28. The semiconductor device according to claim 24, wherein the electrostatic discharge protection circuit is made of a diode.

29. The semiconductor device according to claim 24, wherein the external connection terminal includes bumps.

30. A semiconductor device comprising:

an input/output circuit formed close to an edge of a semiconductor chip;

a functional module formed on the semiconductor chip located on a central side with regard to the input/output circuit;

bumps arranged on one of major surfaces of the semiconductor chip;

a package substrate connected to the semiconductor chip by the bumps;

an electrostatic discharge protection circuit, formed inside the package substrate, configured to protect a circuit located in a downstream thereof, from being destructed by electrostatic discharge; and an external connection terminal provided on a surface of the package substrate, opposite to a surface to which the semiconductor chip is connected, the external connection terminal being connected to the functional module of the semiconductor chip via the electrostatic discharge protection circuit.

31. The semiconductor device according to claim 30, wherein the bumps includes a first bump and a second bump, the first bump is connected to the functional module by a first interconnection, the second bump is connected to the functional module by a second interconnection, and the electrostatic discharge protection circuit is connected between the first interconnection and the second interconnection.

32. The semiconductor device according to claim 30, wherein the functional module includes one of a memory device and an analog IP (analog intellectual property).

33. The semiconductor device according to claim 32, wherein the memory device includes a DRAM.

34. The semiconductor device according to claim 30, wherein the electrostatic discharge protection circuit is made of a diode.

35. The semiconductor device according to claim 30, wherein the external connection terminal includes bumps.

* * * * *